(12) United States Patent
Ishii et al.

(10) Patent No.: US 10,520,808 B2
(45) Date of Patent: Dec. 31, 2019

(54) MANUFACTURING METHOD OF DIFFRACTIVE OPTICAL ELEMENTS

(71) Applicants: Fusao Ishii, Pittsburg, PA (US); Nakanishi Mikiko, Tokyo (JP); Takahashi Kazuhiko, Tokyo (JP); Abrakawa Yuji, Tokyo (JP); Keiichi Murakami, Tokyo (JP)

(72) Inventors: Fusao Ishii, Pittsburg, PA (US); Nakanishi Mikiko, Tokyo (JP); Takahashi Kazuhiko, Tokyo (JP); Abrakawa Yuji, Tokyo (JP); Keiichi Murakami, Tokyo (JP)

(73) Assignees: Fusao Ishii, Pittsburgh, PA (US); DOCOMO Incorporated, Tokyo (JP)

( * ) Notice: Subject to any disclaimer, the term of this patent is extended or adjusted under 35 U.S.C. 154(b) by 157 days.

(21) Appl. No.: 15/810,052

(22) Filed: Nov. 11, 2017

(65) Prior Publication Data
US 2019/0079395 A1    Mar. 14, 2019

(51) Int. Cl.
| | | |
|---|---|---|
| *G03F 7/00* | (2006.01) | |
| *G02B 5/18* | (2006.01) | |
| *C03C 15/02* | (2006.01) | |
| *G03F 1/26* | (2012.01) | |
| *G03F 7/20* | (2006.01) | |
| *G03F 7/26* | (2006.01) | |
| *G03F 7/40* | (2006.01) | |

(52) U.S. Cl.
CPC ............ *G03F 7/0005* (2013.01); *C03C 15/02* (2013.01); *G02B 5/1857* (2013.01); *G03F 1/26* (2013.01); *G03F 7/2022* (2013.01); *G03F 7/26* (2013.01); *G03F 7/40* (2013.01); *G03F 7/70425* (2013.01)

(58) Field of Classification Search
CPC . G03F 1/26; G03F 7/2022; G03F 7/26; G03F 7/40; G03F 7/70425; G03F 7/0005; C03C 15/02; G02B 5/1857
USPC ....................................... 430/5, 313
See application file for complete search history.

(56) References Cited

U.S. PATENT DOCUMENTS

| | | | | | |
|---|---|---|---|---|---|
| 6,383,693 | B1 * | 5/2002 | Wu | ........................ | G03F 7/2061 430/296 |
| 7,135,257 | B2 * | 11/2006 | Lu | ............................. | G03F 1/30 430/5 |
| 8,232,215 | B2 * | 7/2012 | Culp | ................. | H01L 21/31144 216/72 |

* cited by examiner

*Primary Examiner* — Christopher G Young
(74) *Attorney, Agent, or Firm* — Bo-In Lin

(57) ABSTRACT

Manufacturing methods are disclosed to produce DOE, HOE and Fresnel optical elements. These methods enable low cost manufacturing with high precision. The methods include lithography, roll-to-roll imprint and UV-casting.

27 Claims, 9 Drawing Sheets

MANUFACTURING METHOD OF DIFFRACTIVE OPTICAL ELEMENTS

CROSS REFERENCE TO RELATED APPLICATIONS

This application is a US Application claiming the Priority Date of Sep. 9, 2017 based on a previously filed Application PCT/US2019/50852 and Application PCT/US2019/50852 is a Non-Provisional Application of a Provisional Application 62/495,286 filed on Sep. 9, 2016. Application 62/495,286 is a Continuation in Part (CIP) of Patent Application PCT/US2014/000153 filed on Jun. 27, 2014, which is a Non-Provisional filing of a Provisional Application 61/957,258 filed on Jun. 27, 2013.

TECHNICAL FIELD

This invention relates to a manufacturing method of diffractive optical elements (DOE) enabling more accurate fabrication combining non-isotropic and isotropic etching. More particularly, this invention relates to eliminating undesired walls and sharp edges of DOEs.

BACKGROUND ART

Diffractive Optical Elements are becoming very important for new displays such as wearable displays, eye-glass displays and short distance projection displays. Conventional optical systems are limited to spherical and aspherical lenses or mirrors, both of which have rotational symmetry for the ease of manufacturing and fabrication. However, this conventional optics cannot provide all necessary optical elements for a see-through display which is very suitable for a wearable display. DOE enables very compact and see-through displays. However the manufacturing method is not necessarily established in accurate and economical ways. Especially the accuracy of lithography is a limiting factor for the precision of DOE. DOE has saw-tooth shaped surfaces and the surfaces are often approximated with multi-level steps so that the present semiconductor technology enables its manufacturing with lithography and etching tools.

According to "Binary Optics Technology", 1989 by Swanson, multi-level steps of $2^N$ can be made with N masks. An example of manufacturing method is 1) Prepare two sets of masks as (1001) in FIG. 1 wherein 1001 is the plain view of a photomask and 1002 is the front view of the photomask with a pattern (1004). 1005 is a substrate with photoresist (1006) coated. 1003 is exposure light. The photoresist (1006) is exposed with the light (1003) and the mask pattern (1004) is copied to the photoresist (1008) after development. The substrate (1009) with the patterned photoresist is etched by the vertical flow of etchant (1007). After etching, the substrate will have two levels; and (2001) in FIG. 2 wherein 2001 is the plain view of a photomask and 2002 is the front view of the photomask with a pattern (2004). 2005 is a substrate having two levels and photoresist (2006) coated. 2003 is exposure light. The photoresist (2006) is exposed with the light (2003) and the mask pattern (2004) is copied to the photoresist (2008) after development. The substrate (2009) with the patterned photoresist is etched by the vertical flow of etchant (2007). After etching, the substrate will have four levels. 2) Prepare a substrate (1005) with photoresist coated (1006). 3) Overlay the mask (1001, 1002, 1004) on the substrate 4) Expose the photoresist with UV light (1003) through the mask so that the pattern of the mask will be transferred to the photoresist. 5) develop the photoresist so that unexposed areas will remain (1008). 6) Etch vertically using such as RIE (reactive ion etch) to create first (3003 and 3006) and third (3005 and 3008) levels (2010). 7) Repeat the same processes with the second mask to create second (3007) and fourth (3009) levels. If the same processes are repeated N times, it will create $2^N$ levels.

However, as that shown in FIG. 4, some miss-alignment between two masks will cause for photoresist to cover unwanted areas (4003, 4004 and 4005) and generate fences (wall shaped protrusion as 4006 and 4008). Specifically, FIG. 4 illustrates that if the mask alignment between the first and the second masks is not perfect and photoresist covers the side walls of substrate, there will be fences (4006, 4008) and protrusion (4007). These are harmful for diffraction and the diffraction efficiency and the directions of diffraction may be altered from the designed values. These fences are undesired and affect the diffraction performance negatively.

The present invention will show how to eliminate these undesirable fences so that DOE can be manufactured more accurately.

SUMMARY OF THE INVENTION

One of the objectives of this invention is to provide a manufacturing method of DOE without fences as shown in FIG. 5. The semiconductor industry often uses a RIE (reactive ion etching) tool for vertical etching. However, this will leave fences when masks are miss-aligned. For example, if a substrate is silicon, SF6 and/or CH4 are often used as etchant for anisotropic (vertical) etching and these will leave fences. To eliminate fences, it is necessary to etch horizontally and it can be achieved with isotropic etchant such as Cl2+HBr+He+O2.

If the substrate is SiO2, an example of etchant for vertical etching is C4F8+CO+O2+Ar. Horizontal etching can be achieved with vapor HF or wet HF.

Another example of this invention is to use an analog mask having grayscale transmission or reflection of light to make DOEs with substantially more levels or nearly smooth slope. The previous example incorporates a single bit mask (black and white) and multiple masks. This analog mask with grayscale has more bits of transmission or reflection levels and only a single mask is used to achieve saw-tooth shaped slopes. A combination of isotropic and anisotropic etchants will remove sharp corners and make the slope smoother.

Another example of this invention is to use a mask less exposure system having gray scale capability. A micromirror having the ability to control the angle of mirror tilt in analog scale or LCOS which can control the reflectance of pixels in analog scale can perform as a mask less exposure system.

DETAIL DESCRIPTIONS OF THE PREFERRED EMBODIMENTS

Figure 1:
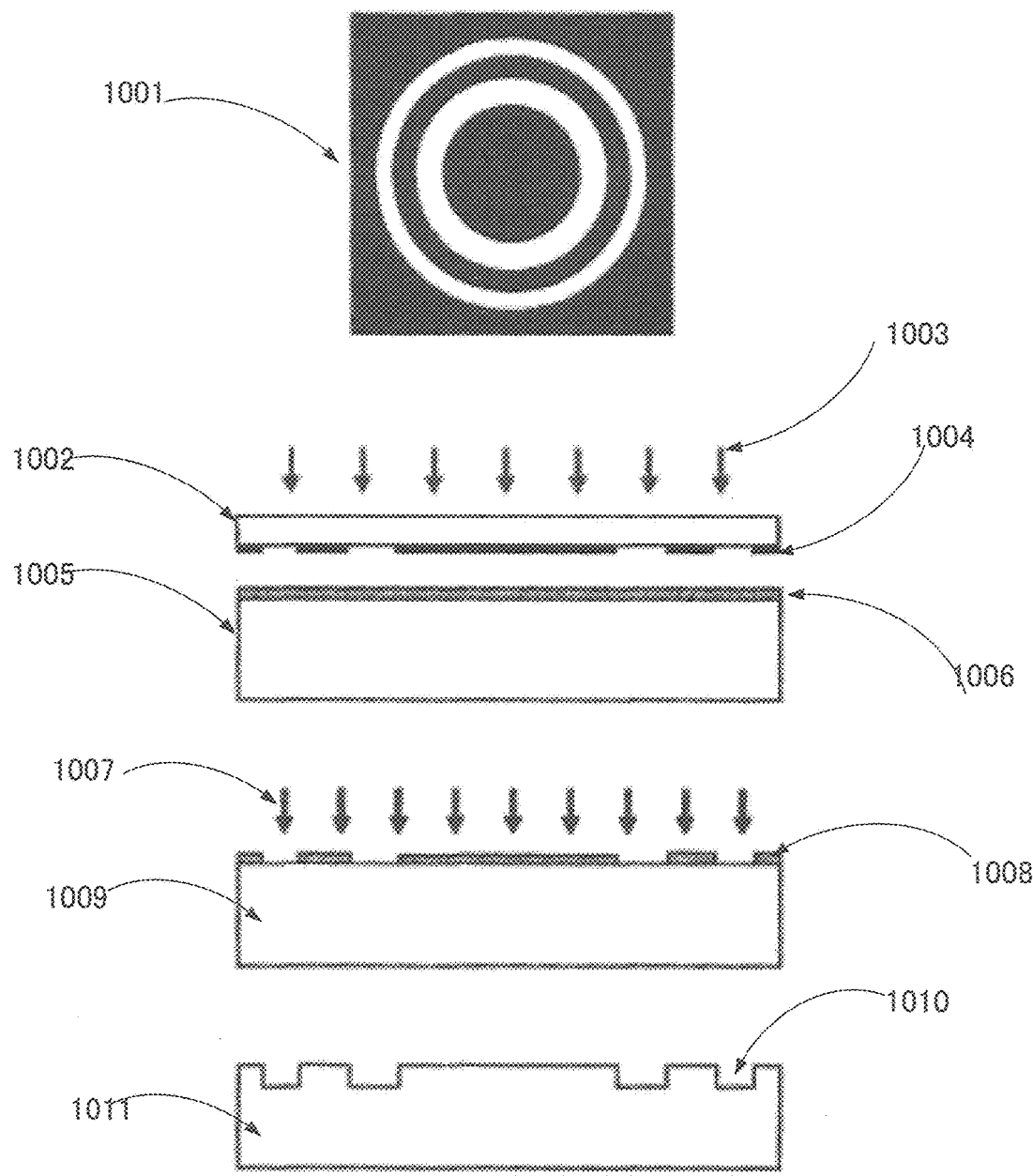
FIG. 1 illustrates an example of process flow of DOE manufacturing.
Figure 2:
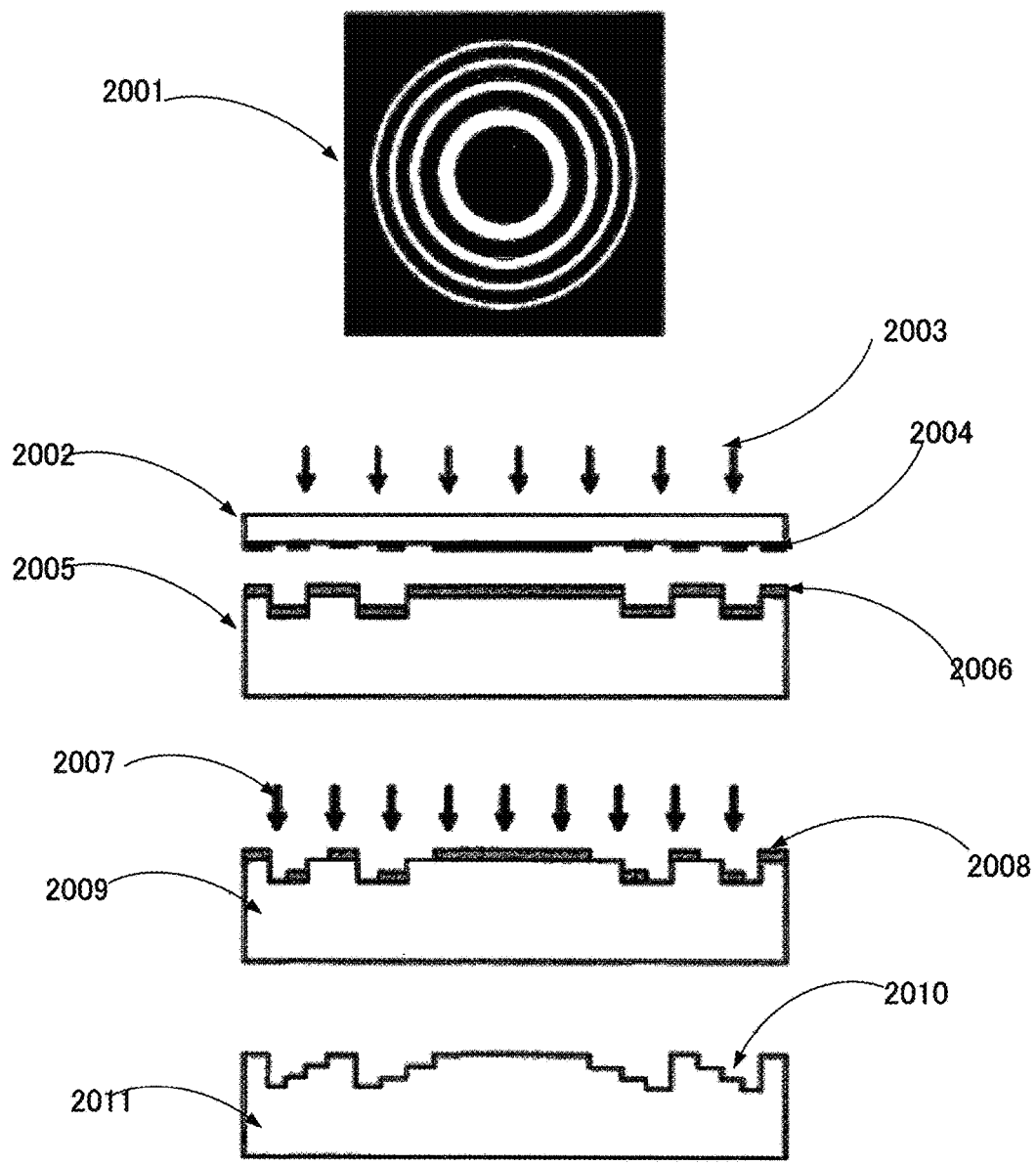
FIG. 2 illustrates an example of the second lithography process flow of DOE manufacturing.
Figure 3:
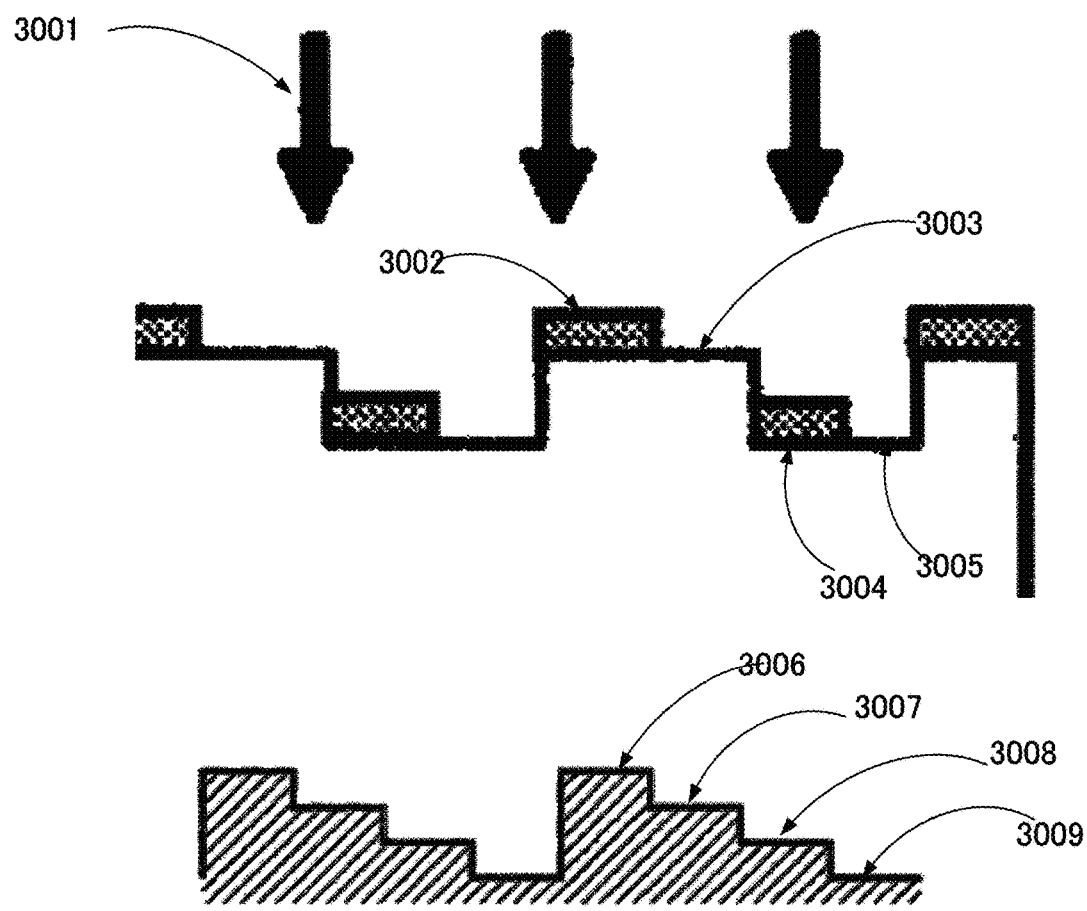
FIG. 3 illustrates that if the mask alignment between the first and the second masks is perfect, the substrate will have four levels without any fences or trenches.
Figure 4:
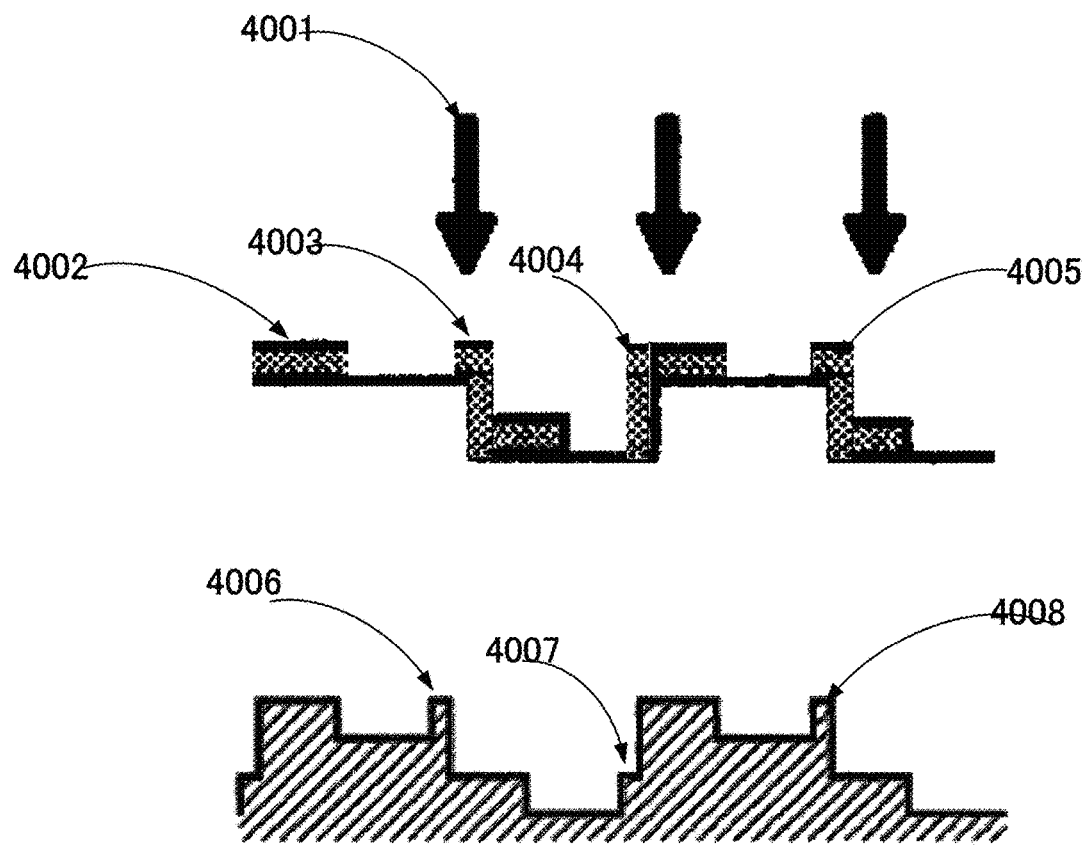
FIG. 4 illustrates that if the mask alignment between the first and the second masks is not perfect and photoresist covers the side walls of substrate, there will be fences
Figure 5:
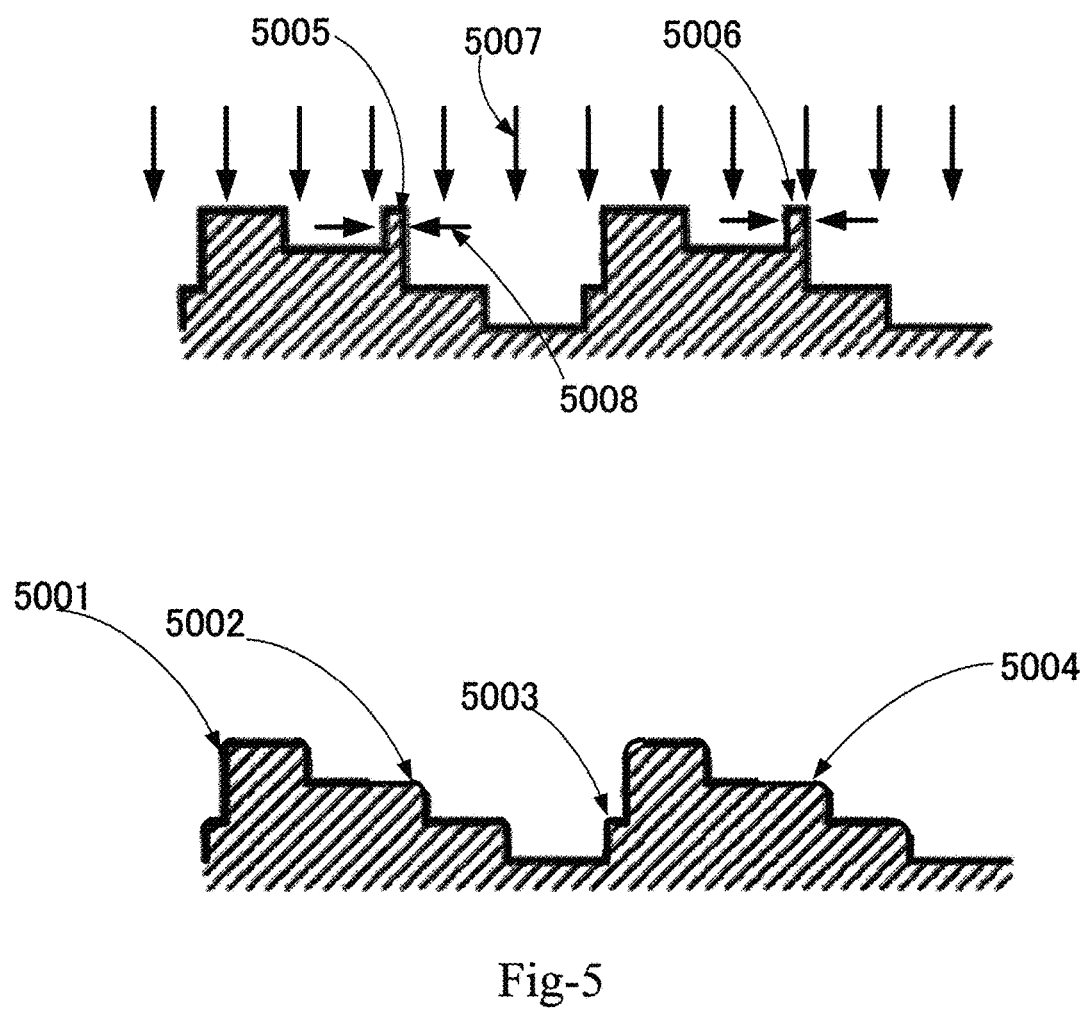
FIG. 5 illustrates an example of this invention to eliminate the fences using horizontal etching.
Figure 9:
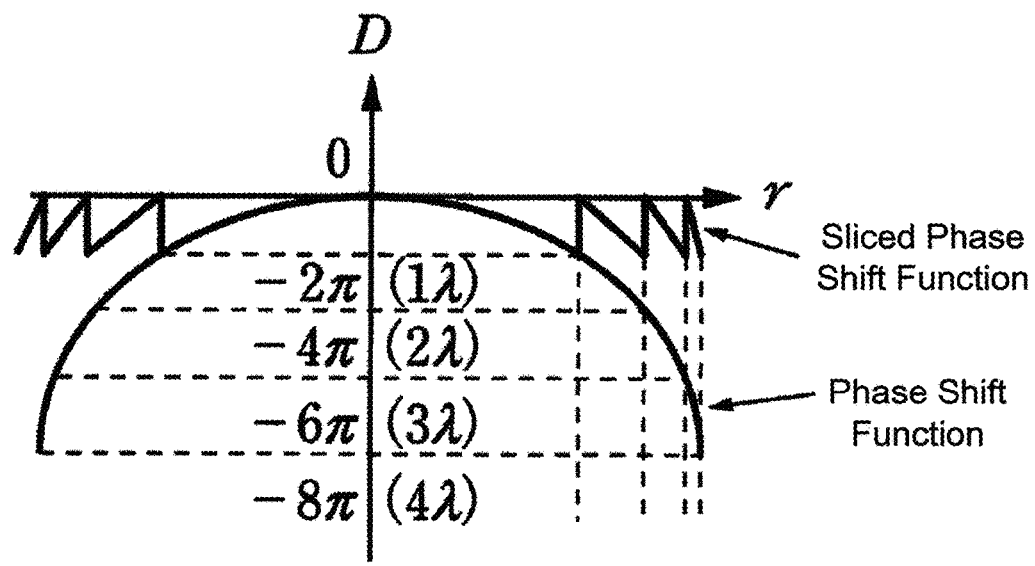
FIG. 9 shows the phase shift function is defined as a function representing the difference of phases of light waves between incoming light wave to a DOE and outgoing light wave from the DOE.
Figure 10:
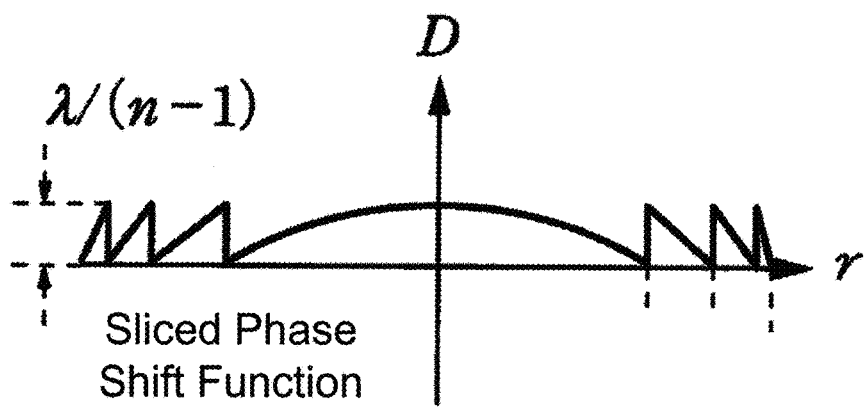
FIG. 10 shows a sliced phase shift function from the phase shift function by slicing in every 2 π.

The objective of this invention is to manufacture high quality DOEs. An example method of embodiments of this invention is 1) Determining a phase shift function of DOE. Phase shift function is defined as a function representing the difference of phases of light waves between incoming light wave to a DOE and outgoing light wave from the DOE as shown in FIG. 9. Specifically, FIG. 9 illustrates an example showing how to create a Sliced Phase Shift Pattern (9006) from a "Phase Shift Pattern" (9001). The vertical axis (9005) represents the value of phase shift of incoming light which determines the direction of outgoing light. This phase shift function is divided in every 2*π (pai) and the slice (9002) between −2 π and −4 π is shifted up to the zero location (9003) to form a Sliced Phase Function. A conventional optical system allows only fixed amount of phase shift such as refraction determined by the slope and the refractive index of lens or symmetric reflection by a mirror. In case of DOE or HOE (holographic optical element), any shift is allowed in theory. This will provide tremendous freedom. 2) Calculating a sliced phase shift function from the phase shift function by slicing in every 2 π as shown in FIG. 10. Specifically, FIG. 10 shows how to convert a Sliced Phase Function to a physical DOE. The depth (10001) represents 2 π phase shift and this 2 π phase shift can be achieved if the depth (10001) is set to $\lambda/(n-1)$, where $\lambda$ is the wavelength (usually sub-microns) of incoming light and "n" is the refractive index of media (the material of DOE) if transmissive, or $\lambda/2$, if reflective. If the DOE is transmissive, the height of the sliced phase function is $\lambda/(n-1)$, where $\lambda$ is the wave length of the incoming wave and n is the refractive index of substrate. If the DOE is reflective, the height is $\lambda/2$. 3) Preparing a substrate such as glass (transmissive) or silicon (reflective). 4) Applying photoresist on the substrate. 5) Preparing N pieces of photomasks which create $2^N$ levels of steps whose slope at each location corresponds to the slope of said sliced phase shift function 6) Exposing the pattern of the photomask onto the photoresist. 7) Developing the exposed photoresist. 8) Etching the substrate at the opening of the photoresist in the depth of $\lambda/(n-1)$ in case of transmissive or $\lambda/2$ in case of reflective with vertical etching such as reactive ion etching (RIE). 9) Stripping the photoresist. 10) Repeat 4) through 9) (N−1) times using one of the N masks consecutively. 11) Etching the substrate with isotropic or horizontal etchant(s) to remove any fences and protrusions as shown in FIG. 5. The fences (5005 and 5006) cannot be etched off by vertical etching (5007) because etch back with vertical etching is conformal. Removing the fences requires horizontal etching. Horizontal etching (5008) can be achieved with isotropic etchants such as Cl2 combined with HBr, He and O2 for silicon substrates and vapor HF or wet HF for SiO2 substrates.

Figure 6:
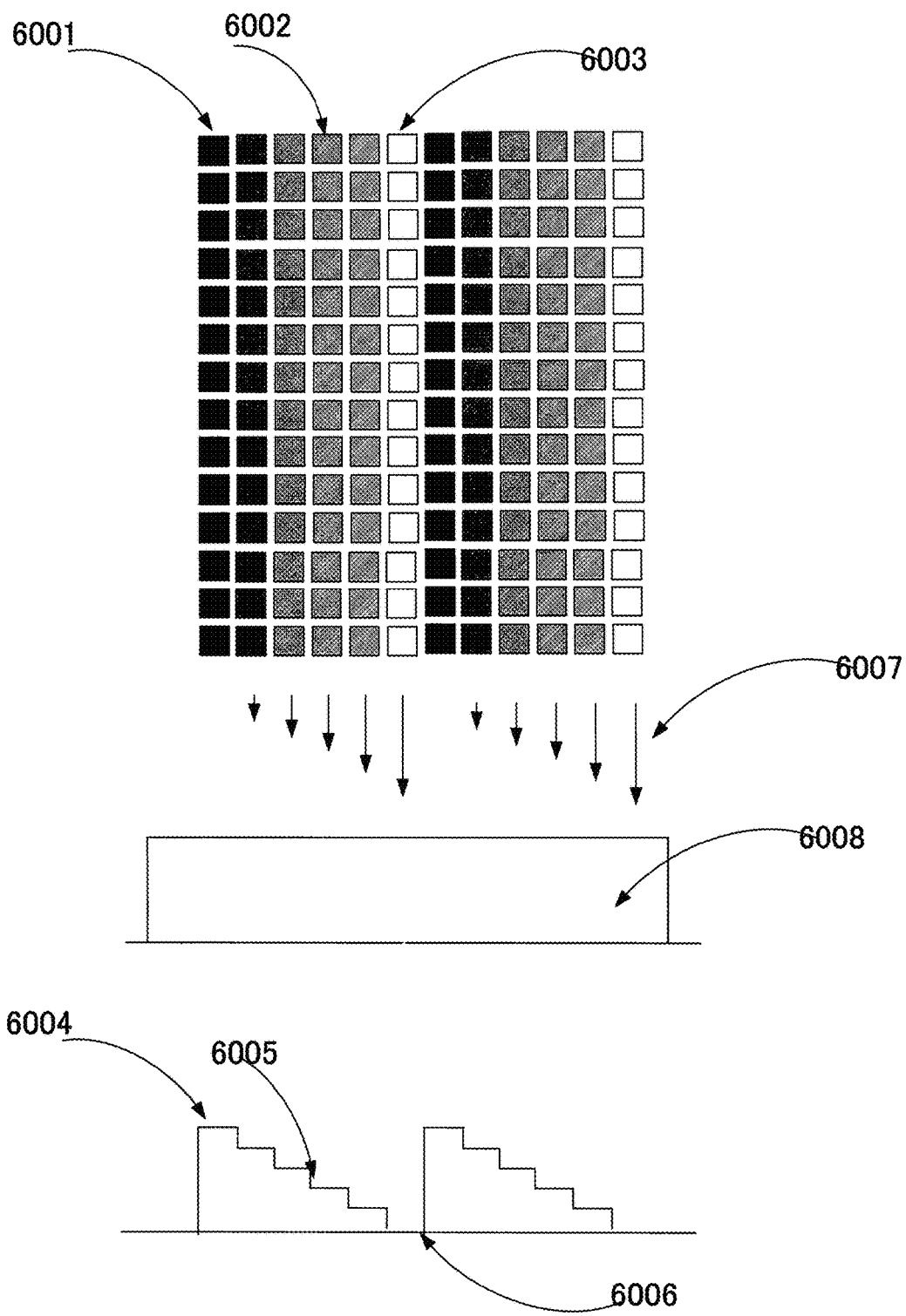
FIG. 6 illustrates another example of manufacturing method to create multi-level DOEs.
Figure 8:
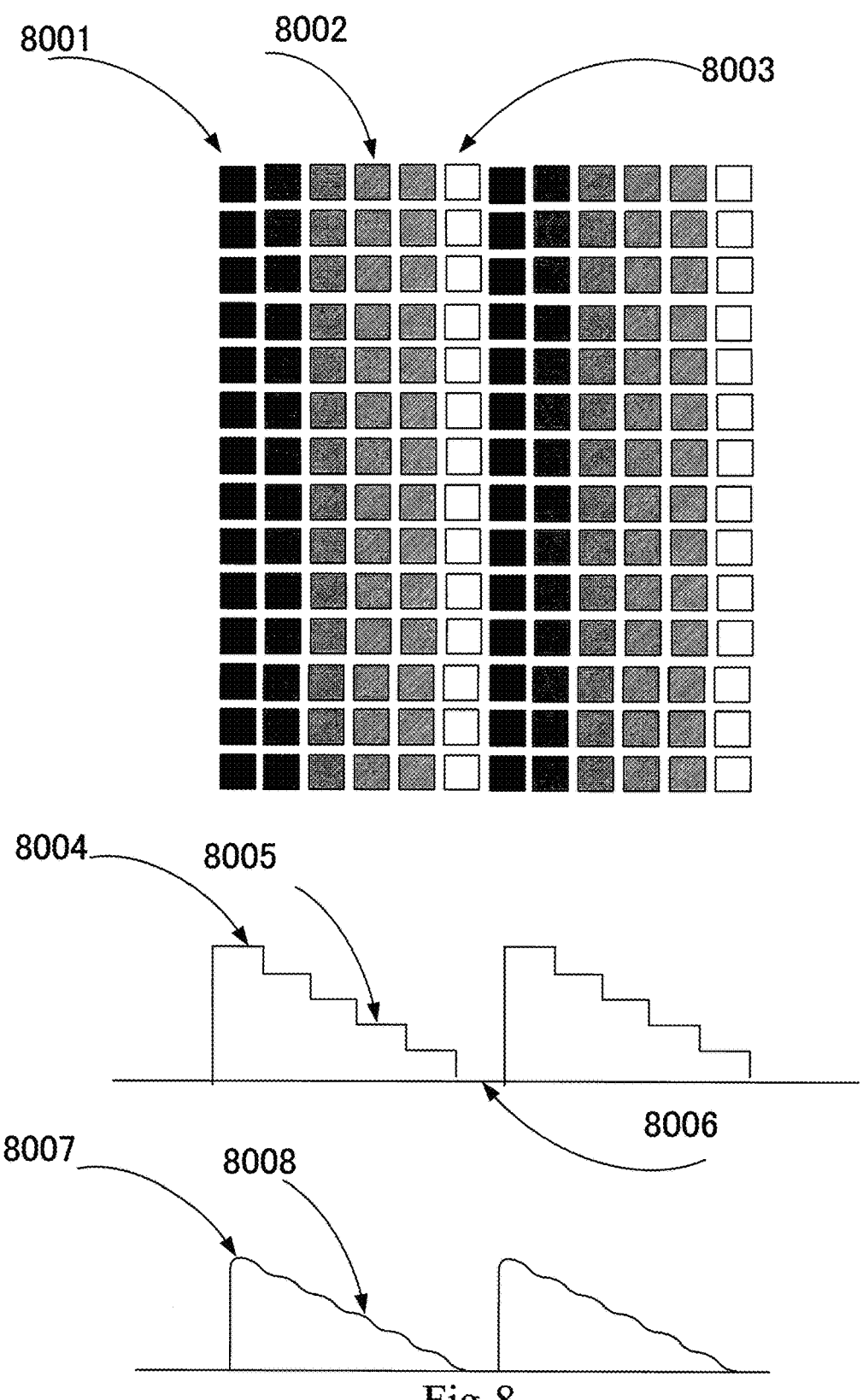
FIG. 8 illustrates an example of this invention wherein the sharp corners of steps (8004, 8005) are etched off by isotropic etching on top of anisotropic etching.

Another example of embodiments of this invention is illustrated in FIG. 6 and FIG. 8. The steps are 1) Determining a phase shift function of DOE. Phase shift function is defined as a function representing the difference of phases of light waves between incoming light wave to a DOE and outgoing light wave from the DOE as shown in FIG. 6. Specifically, a photomask having an analog grayscale pattern (6001, 6002 and 6003) is used to expose a photoresist layer (6008), wherein 6001 is black, 6002 is gray and 6003 is white. The photomask can be a transmissive or reflective mask. Analog means that grayscale is created by varying the transmission or the reflectance of each pixel. The mask can be a display device having controllable light reflectance or transmission in multiple levels of grayscale. The photoresist is exposed with the exposure light (6007). Because the depth of etching of the resist by development is a function of or preferably proportional to the intensity of the exposed light, multi-level of steps will be formed (6004, 6005 and 6006). Because of a single mask, it will be easier to have much more levels than the previous method. However still harp corners will remain, which negatively affects the diffractive efficiency. The smoother the slope, the higher the efficiency. 3) Preparing a substrate such as glass (transmissive) or silicon (reflective). 4) Applying photoresist on the substrate. 5) Preparing a single photomask which represents the sliced phase shift function with grayscale patterns in an analog way, where the transmittance or the reflection of an entire single pixel is relatively uniform. 6) Exposing the pattern of the photomask onto the photoresist. 7) Developing the exposed photoresist. 8) Etching the substrate to form the shape of the sliced phase shift function in the depth of $\lambda/(n-1)$ in case of transmissive or $\lambda/2$ in case of reflective with vertical etching such as reactive ion etching (RIE). 9) Stripping the photoresist. 10) Etching the substrate with isotropic or horizontal etchant(s) to remove any sharp corners and protrusions as shown in FIG. 8. Removing the sharp corners and protrusions requires horizontal etching. Horizontal etching can be achieved with isotropic etchants such as Cl2 combined with HBr, He and O2 for silicon substrates and vapor HF or wet HF for SiO2 substrates.

Figure 7:
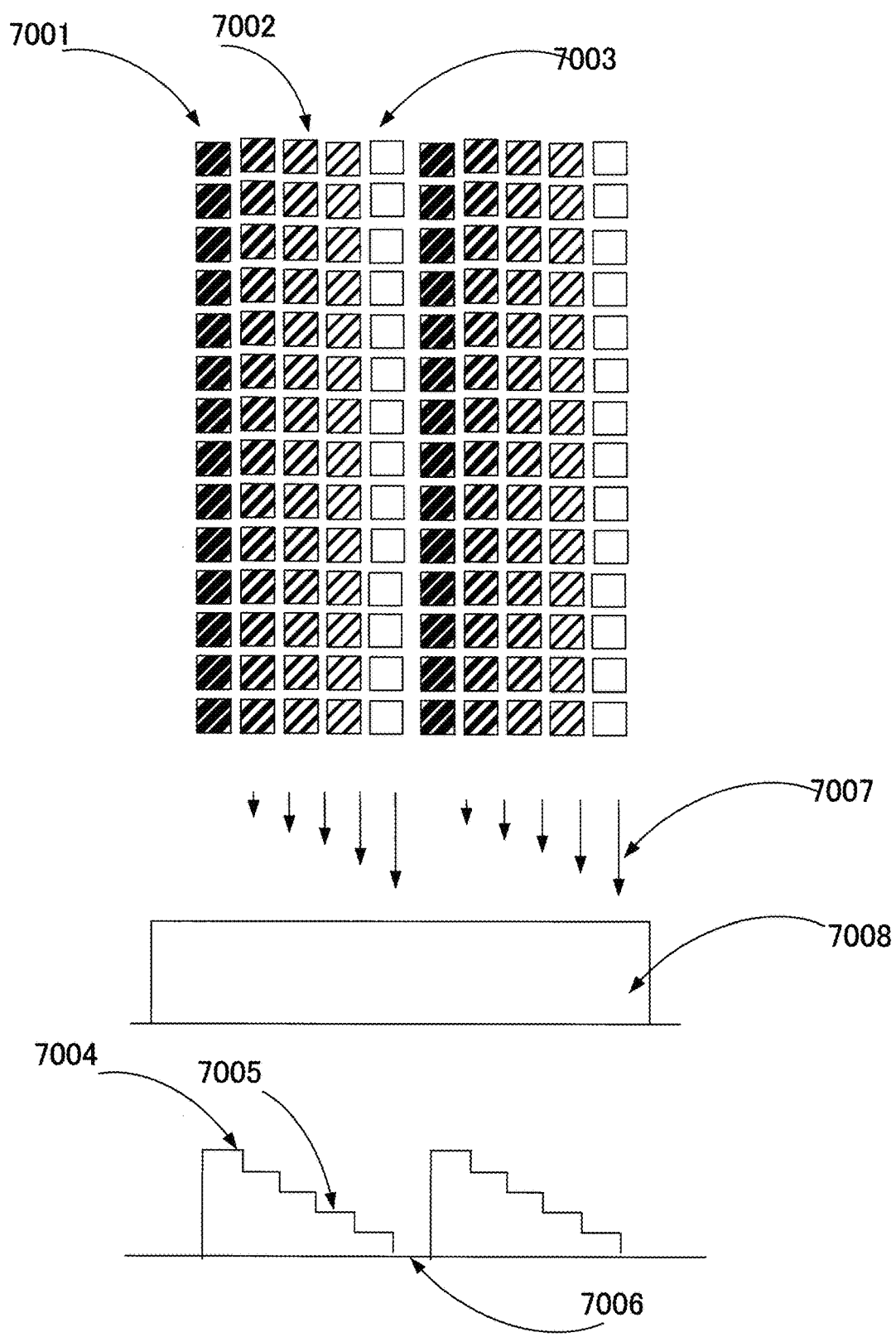
FIG. 7 illustrates another example of DOE manufacturing method, wherein the grayscale of each pixel is created by a digital way, meaning that each pixel has a different percentage of black and white areas.

Another example of embodiments of this invention is illustrated in FIG. 7. The steps are 1) Determining a phase shift function of DOE. Phase shift function is defined as a function representing the difference of phases of light waves between incoming light wave to a DOE and outgoing light wave from the DOE as shown in FIG. 6. 3) Preparing a substrate such as glass (transmissive) or silicon (reflective). 4) Applying photoresist on the substrate. 5) Preparing a single photomask which represents the sliced phase shift function with grayscale patterns in a digital way, where minute size of black and white patterns are printed in a pixel and the density of black is determined based on the intensity of grayscale and the resolution of the exposure system is not so good as resolving the minute black and white patterns, although as good as resolving the pixel size. 6) Exposing the pattern of the photomask onto the photoresist. 7) Developing the exposed photoresist. 8) Etching the substrate to form the shape of the sliced phase shift function in the depth of $\lambda/(n-1)$ in case of transmissive or $\lambda/2$ in case of reflective with vertical etching such as reactive ion etching (RIE). 9) Stripping the photoresist. 10) Etching the substrate with isotropic or horizontal etchant(s) to remove any sharp corners and protrusions as shown in FIG. 8. Removing the sharp, corners and protrusions requires horizontal etching.

Horizontal etching can be achieved with isotropic etchants such as Cl2 combined with HBr, He and O2 for silicon substrates and vapor HF or wet HF for SiO2 substrates.

According to FIGS. 2 to 5 and 8, this invention discloses a method for manufacturing a diffractive optical element (DOE) on a substrate coated with a photoresist comprising the steps of A) preparing a plurality of photomasks corresponding to a plurality levels of phase-shift at predesignated locations on the substrate and applying the photomasks on top of the photoresist followed by exposing the photoresist to a plurality of photolithographic exposures; B) developing the photoresist after the photolithographic exposure into a top surface of multiple horizontal levels followed by etching the substrate over the photoresist to form a plurality of top surface levels on the substrate corresponding to the plurality levels of phase-shift at the predesignated locations on the substrate; and C) applying isotropic etchants to horizontally etch the substrate for removing fences and sharp corners on top of the substrate. In a preferred embodiment, the method further comprises a step of calculating a phase shift function of DOE and dividing the phase shift function in a pitch of $2\pi$ into a sliced phase shift function wherein the sliced phase function with a saw-tooth shape has a same slope as the slope of the phase shift function in each slice. In another embodiment, the step of preparing a plurality of photomasks further comprises a step of preparing a total of N photomasks where N is a positive integer and the N photomasks create $2^N$ levels of steps with a slope at each location corresponds to the slope of the sliced phase shift function. In another embodiment, the step of preparing a plurality of photomasks further comprises a step of preparing a total of N photomasks where N is a positive integer and the N photomasks corresponding to a $2^N$ levels of phase-shift in a pitch of $2\pi$ at predesignated locations on the substrate. In another embodiment, the step of etching the substrate over the photoresist further comprises a step of vertically etching over the photoresist anisotropically to form a plurality of top surface levels on the substrate. In another embodiment, the step of etching the substrate over the photoresist further comprises a step of vertically etching over the photoresist anisotropically by applying SF6 to form a plurality of top surface levels on a silicon substrate. In another embodiment, the step of etching the substrate over the photoresist further comprises a step of vertically etching over the photoresist anisotropically by applying CH4 to form a plurality of top surface levels on a silicon substrate. In another embodiment, the step of applying the isotropic etchants further comprises a step of applying the isotropic etchant of Cl2+HBr+He+O2 to horizontally etch the substrate for removing fences and sharp corners on top of a silicon substrate. In another embodiment, the step of applying the isotropic etchants further comprises a step of applying the isotropic etchant of vapor HF or wet HF to horizontally etch the substrate for removing fences and sharp corners on top of a SiO2 substrates.

According to FIGS. 6 and 8, this invention discloses a method for manufacturing a diffractive optical element (DOE) on a substrate coated with a photoresist comprising the steps of A) preparing a photomask with a pattern of different grayscales corresponding to a plurality levels of phase-shift at predesignated locations on the substrate and applying the photomask on top of the photoresist followed by exposing the photoresist to a photolithographic exposure; B) developing the photoresist after the photolithographic exposure into a top surface of multiple horizontal levels followed by etching the substrate over the photoresist to form a plurality of top surface levels on the substrate corresponding to the plurality levels of phase-shift at the predesignated locations on the substrate; and C) applying isotropic etchants to horizontally etch the substrate for removing sharp corners on top of the substrate. In a preferred embodiment, the step of preparing a photomask with a pattern of different grayscales corresponding to a plurality levels of phase-shift at predesignated locations on the substrate further comprises a step of preparing the photomask with an analog pattern of different grayscales. In another embodiment, the step of preparing a photomask with a pattern of different grayscales corresponding to a plurality levels of phase-shift at predesignated locations on the substrate further comprises a step of preparing the photomask with a digital pattern of different grayscales. In another embodiment, the step of etching the substrate over the photoresist further comprises a step of vertically etching over the photoresist anisotropically to form a plurality of top surface levels on the substrate. In another embodiment, the step of etching the substrate over the photoresist further comprises a step of vertically etching over the photoresist anisotropically by applying SF6 to form a plurality of top surface levels on a silicon substrate. In another embodiment, the step of etching the substrate over the photoresist further comprises a step of vertically etching over the photoresist anisotropically by applying CH4 to form a plurality of top surface levels on a silicon substrate. In another embodiment, the step of applying the isotropic etchants further comprises a step of applying the isotropic etchant of Cl2+HBr+He+O2 to horizontally etch the substrate for removing sharp corners on top of a silicon substrate. In another embodiment, the step of applying the isotropic etchants further comprises a step of applying the isotropic etchant of vapor HF or wet HF to horizontally etch the substrate for removing sharp corners on top of a SiO2 substrates.

According to FIGS. 6 and 8, this invention discloses a method for manufacturing a diffractive optical element (DOE) on a substrate coated with a photoresist comprising the steps of A) preparing a photolithographic exposure system with a 2D array of pixels with controllable intensity pattern of projection light corresponding to a plurality levels of phase-shift at predesignated locations on the substrate and exposing the photoresist to the projection light; and B) developing the photoresist after the photolithographic exposure into a top surface of multiple horizontal levels. In another embodiment, the method further comprises a step of applying a hard molding material to form a molded-shape of photoresist and applying the molded-shape of the hard molding material to duplicate the molded-shape to a plastic material by applying a method selected from a group of methods consisted of thermal press, UV casting, roll-to-roll thermal imprint and roll-to-roll UV casting. In another embodiment, the method further comprises a step of preparing a photomask with a pattern of different grayscales corresponding to a plurality levels of phase-shift at predesignated locations on the substrate further comprises a step of preparing the photomask with an analog pattern of different grayscales. In another embodiment, the method further comprises a step of etching the substrate over the photoresist to form a plurality of top surface levels on the substrate corresponding to the plurality levels of phase-shift at the predesignated locations on the substrate; and applying isotropic etchants to horizontally etch the substrate for removing sharp corners on top of the substrate. In another embodiment, the step of etching the substrate over the photoresist further comprises a step of vertically etching over the photoresist anisotropically to form a plurality of top surface levels on the substrate. In another embodiment, the step of etching the substrate over the photoresist further comprises a step of vertically etching over the photoresist anisotropically by applying SF6 to form a plurality of top surface levels on a silicon substrate. In another embodiment, the e step of etching the substrate over the photoresist further comprises a step of vertically etching over the photoresist anisotropically by applying CH4 to form a plurality of top surface levels on a silicon substrate. In another embodiment, the step of applying the isotropic etchants further comprises a step of applying the isotropic etchant of Cl2+HBr+He+O2 to horizontally etch the substrate for removing sharp corners on top of a silicon substrate, In another embodiment, the step of applying the isotropic etchants further comprises a step of applying the isotropic etchant of vapor HF or wet HF to horizontally etch the substrate for removing sharp corners on top of a SiO2 substrates.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A method for manufacturing a diffractive optical element (DOE) on a substrate coated with a photoresist comprising:
   preparing a plurality of photomasks corresponding to a plurality levels of phase-shift at predestinated locations on the substrate and applying the photomasks on top of the photoresist followed by exposing the photoresist to a plurality of photolithographic exposures;
   developing the photoresist after the photolithographic exposure into a top surface of multiple horizontal levels followed by etching the substrate over the photoresist to form a plurality of top surface levels on the substrate corresponding to the plurality levels of phase-shift at the predestinated locations on the substrate; and
   applying isotropic etchants to horizontally etch the substrate for removing fences and sharp corners on top of the substrate.

2. The method of claim 1 further comprising:
   calculating a phase shift function of DOE and dividing the phase shift function in a pitch of $2\pi$ into a sliced phase shift function wherein the sliced phase function with a saw-tooth shape has a same slope as the slope of the phase shift function in each slice.

3. The method of claim 2 wherein:
   the step of preparing a plurality of photomasks further comprises a step of preparing a total of N photomasks where N is a positive integer and the N photomasks create $2^N$ levels of steps with a slope at each location corresponds to the slope of the sliced phase shift function.

4. The method of claim 1 wherein:
   the step of preparing a plurality of photomasks further comprises a step of preparing a total of N photomasks where N is a positive integer and the N photomasks corresponding to a $2^N$ levels of phase-shift in a pitch of $2\pi$ at predestinated locations on the substrate.

5. The method of claim 1 wherein:
   the step of etching the substrate over the photoresist further comprises a step of vertically etching over the photoresist anisotropically to form a plurality of top surface levels on the substrate.

6. The method of claim 1 wherein:
   the step of etching the substrate over the photoresist further comprises a step of vertically etching over the photoresist anisotropically by applying SF6 to form a plurality of top surface levels on a silicon substrate.

7. The method of claim 1 wherein:
   the step of etching the substrate over the photoresist further comprises a step of vertically etching over the photoresist anisotropically by applying CH4 to form a plurality of top surface levels on a silicon substrate.

8. The method of claim 1 wherein:
   the step of applying the isotropic etchants further comprises a step of applying the isotropic etchant of Cl2+HBr+He+O2 to horizontally etch the substrate for removing fences and sharp corners on top of a silicon substrate.

9. The method of claim 1 wherein:
   the step of applying the isotropic etchants further comprises a step of applying the isotropic etchant of vapor HF or wet HF to horizontally etch the substrate for removing fences and sharp corners on top of a SiO2 substrates.

10. A method for manufacturing a diffractive optical element (DOE) on a substrate coated with a photoresist comprising:
    preparing a photomask with a pattern of different grayscales corresponding to a plurality levels of phase-shift at predestinated locations on the substrate and applying the photomask on top of the photoresist followed by exposing the photoresist to a photolithographic exposure;
    developing the photoresist after the photolithographic exposure into a top surface of multiple horizontal levels followed by etching the substrate over the photoresist to form a plurality of top surface levels on the substrate corresponding to the plurality levels of phase-shift at the predestinated locations on the substrate; and
    applying isotropic etchants to horizontally etch the substrate for removing sharp corners on top of the substrate.

11. The method of claim 10 wherein:
    the step of preparing a photomask with a pattern of different grayscales corresponding to a plurality levels of phase-shift at predestinated locations on the substrate further comprises a step of preparing the photomask with an analog pattern of different grayscales.

12. The method of claim 10 wherein:
    the step of preparing a photomask with a pattern of different grayscales corresponding to a plurality levels of phase-shift at predestinated locations on the substrate further comprises a step of preparing the photomask with a digital pattern of different grayscales.

13. The method of claim 10 wherein:
    the step of etching the substrate over the photoresist further comprises a step of vertically etching over the photoresist anisotropically to form a plurality of top surface levels on the substrate.

14. The method of claim 10 wherein:
    the step of etching the substrate over the photoresist further comprises a step of vertically etching over the photoresist anisotropically by applying SF6 to form a plurality of top surface levels on a silicon substrate.

15. The method of claim 10 wherein:
    the step of etching the substrate over the photoresist further comprises a step of vertically etching over the photoresist anisotropically by applying CH4 to form a plurality of top surface levels on a silicon substrate.

16. The method of claim 10 wherein:

the step of applying the isotropic etchants further comprises a step of applying the isotropic etchant of Cl2+HBr+He+O2 to horizontally etch the substrate for removing sharp corners on top of a silicon substrate.

17. The method of claim 10 wherein:

the step of applying the isotropic etchants further comprises a step of applying the isotropic etchant of vapor HF or wet HF to horizontally etch the substrate for removing sharp corners on top of a SiO2 substrates.

18. A method for manufacturing a diffractive optical element (DOE) on a substrate coated with a photoresist comprising:

preparing a photolithographic exposure system with a 2D array of pixels with controllable intensity pattern of projection light corresponding to a plurality levels of phase-shift at predestinated locations on the substrate and exposing the photoresist to the projection light; and developing the photoresist after the photolithographic exposure into a top surface of multiple horizontal levels.

19. The method of claim 18 further comprising:

applying a hard molding material to form a molded-shape of photoresist and applying the molded-shape of the hard molding material to duplicate the molded-shape to a plastic material by applying a method selected from a group of methods consisted of thermal press, UV casting, roll-to-roll thermal imprint and roll-to-roll UV casting.

20. The method of claim 18 further comprising:

preparing a photomask with a pattern of different grayscales corresponding to a plurality levels of phase-shift at predestinated locations on the substrate further comprises a step of preparing the photomask with an analog pattern of different grayscales.

21. The method of claim 20 further comprising:

applying a hard molding material to form a molded-shape of photoresist and applying the molded-shape of the hard molding material to duplicate the molded-shape to a plastic material by applying a method selected from a group of methods consisted of thermal press, UV casting, roll-to-roll thermal imprint and roll-to-roll UV casting.

22. The method of claim 18 further comprising:

etching the substrate over the photoresist to form a plurality of top surface levels on the substrate corresponding to the plurality levels of phase-shift at the predestinated locations on the substrate; and applying isotropic etchants to horizontally etch the substrate for removing sharp corners on top of the substrate.

23. The method of claim 22 wherein:

the step of etching the substrate over the photoresist further comprises a step of vertically etching over the photoresist anisotropically to form a plurality of top surface levels on the substrate.

24. The method of claim 22 wherein:

the step of etching the substrate over the photoresist further comprises a step of vertically etching over the photoresist anisotropically by applying SF6 to form a plurality of top surface levels on a silicon substrate.

25. The method of claim 22 wherein:

the step of etching the substrate over the photoresist further comprises a step of vertically etching over the photoresist anisotropically by applying CH4 to form a plurality of top surface levels on a silicon substrate.

26. The method of claim 22 wherein:

the step of applying the isotropic etchants further comprises a step of applying the isotropic etchant of Cl2+HBr+He+O2 to horizontally etch the substrate for removing sharp corners on top of a silicon substrate.

27. The method of claim 22 wherein:

the step of applying the isotropic etchants further comprises a step of applying the isotropic etchant of vapor HF or wet HF to horizontally etch the substrate for removing sharp corners on top of a SiO2 substrates.

\* \* \* \* \*